United States Patent [19]
Kirkpatrick

[11] Patent Number: 5,320,225
[45] Date of Patent: Jun. 14, 1994

[54] APPARATUS AND METHOD FOR SECURELY CARRYING A SUBSTRATE

[75] Inventor: John Kirkpatrick, Pflugerville, Tex.

[73] Assignee: HRC Products, Pflugerville, Tex.

[21] Appl. No.: 52,950

[22] Filed: Apr. 23, 1993

[51] Int. Cl.$^5$ .................. B65D 85/48; A45D 42/14
[52] U.S. Cl. .................................. 206/449; 53/472; 206/454; 206/829; 248/362; 248/363
[58] Field of Search .............. 206/449, 454–456, 206/829, 328, 334; 248/206.3, 362, 363; 53/472

[56] References Cited

U.S. PATENT DOCUMENTS

| | | | |
|---|---|---|---|
| 2,317,348 | 4/1943 | Wekeman | 248/363 |
| 3,385,462 | 5/1968 | Deldime et al. | 206/454 X |
| 3,659,818 | 5/1972 | Duncan | 248/363 |
| 4,422,547 | 12/1983 | Abe et al. | 206/454 X |
| 4,611,716 | 9/1986 | Sorlien | 206/829 X |
| 4,776,462 | 10/1988 | Kosugi et al. | 206/449 X |
| 4,842,136 | 6/1989 | Nakazato et al. | 206/328 |

Primary Examiner—Bryon P. Gehman
Attorney, Agent, or Firm—Shaffer & Culbertson

[57] ABSTRACT

A container or carrier for securely carrying a substrate such as a reticle, mask, wafer, or the like during a semiconductor manufacturing process or during the transport of the substrate. The container includes a housing having an opening through which the substrate may be inserted and removed. The housing includes an open box and a lid, the lid securely held in place by a unique latching mechanism. A door that is hinged upon the lid and held in place by biasing springs substantially seals the housing opening. Within the housing are a plurality of suction cups upon which the substrate rests and which apply suction to firmly engage the substrate on only one side when the substrate is in a contained position. The suction cups hold the substrate in the contained position thereby preventing relative motion between the container and the substrate. The invention further provides for increasing the suction applied by the suction cups to the substrate by applying additional suction to modified suction cups from a vacuum pump. The invention also provides a method for securely containing a substrate within a container. The method including the step of fixing the substrate in a contained position within the substrate using suction.

16 Claims, 2 Drawing Sheets

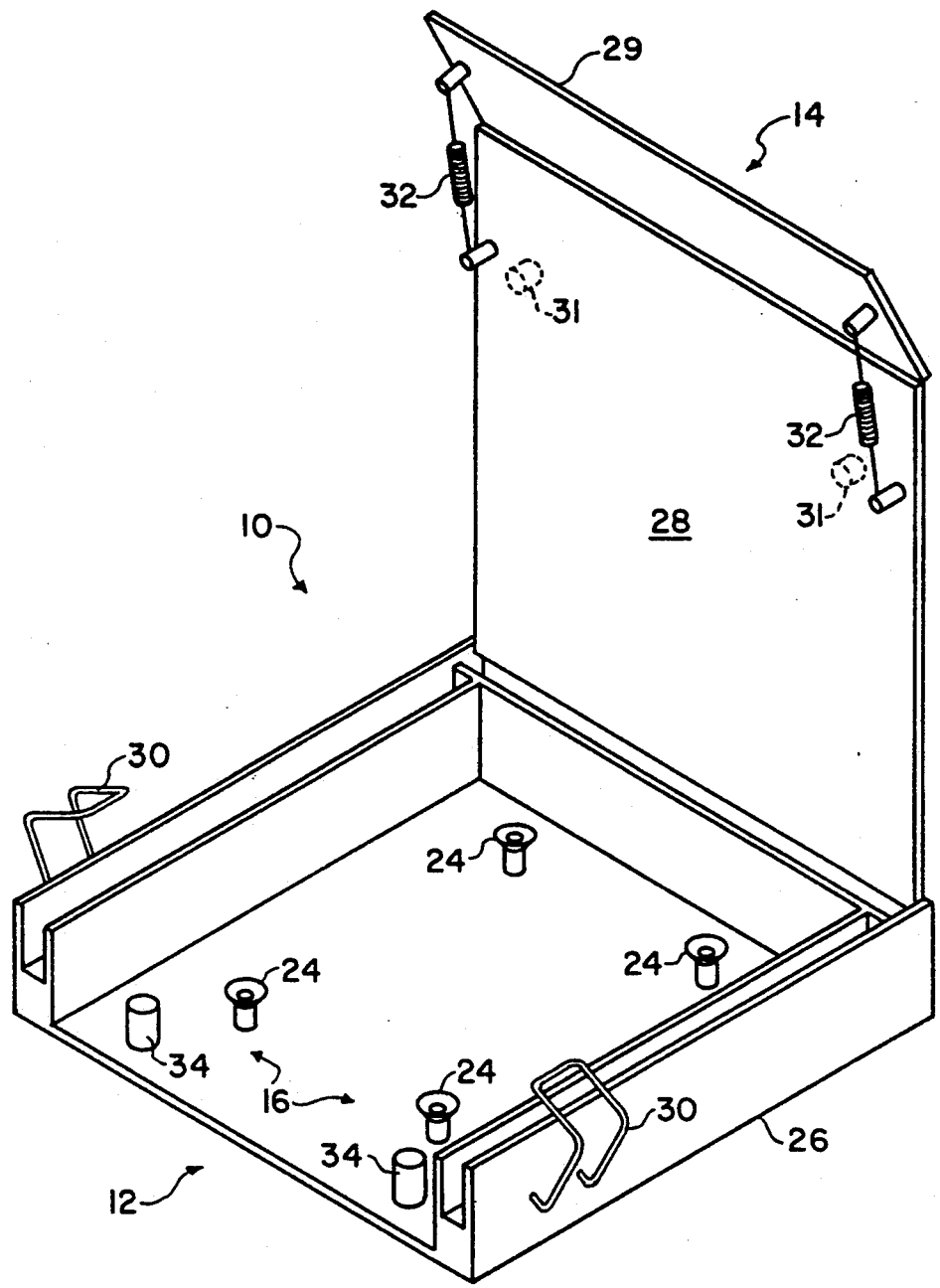
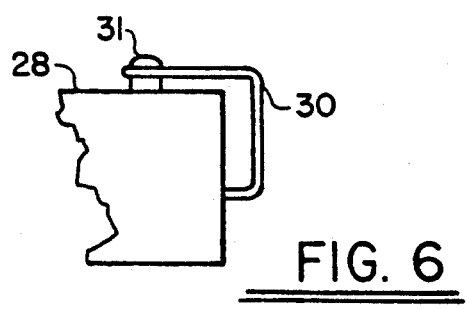
FIG. 6
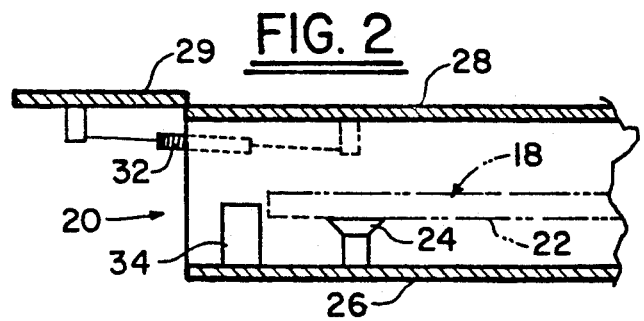
FIG. 2

APPARATUS AND METHOD FOR SECURELY CARRYING A SUBSTRATE

BACKGROUND OF THE INVENTION

The present invention relates to a container for securely carrying a substrate such as a reticle, mask, wafer, or the like. More particularly, the present invention relates to a container that may be used to store the substrate when not in use or that may be used to contain the substrate for transport.

Semiconductor manufacturing processes involve the use of reticles, masks and wafers which generally take the form of a substantially planar substrate. During the manufacture of semiconductor devices, small particles of foreign material may settle upon the particular substrate and damage the substrate or interfere with a manufacturing process. Great efforts are made to filter all particles from the environment in which semiconductor devices are manufactured and to prevent particles from contacting substrates. A continuing challenge in the industry is to remove smaller and smaller particles, even sub-micron sized particles, from the manufacturing environment and the associated equipment and to eliminate the introduction of particles into the environment from the equipment itself.

Prior devices minimized the settling of particles upon substrates by providing a container that was capable of housing the substrate. U.S. Pat. No. 4,422,547 to Abe et al., for example, described a container comprising a housing body that included an opening for receiving a substrate, a door for closing the opening, and means for fixing the received substrate in the container. The means for fixing the received substrate included a contact member for contacting the upper surface of the substrate to press it against a support surface in the housing when the door was closed. The contact member was adapted to retract to release the substrate when the door was opened. While the Abe et at. container prevented particles generated externally from settling onto the substrate, the device itself generated particles within the container which settled upon the substrate.

Some of the particles generated within the Abe et at. device were produced by the mechanism for fixing the substrate in the container. The mechanism for fixing the substrate in the container included a stainless steel member which rotated within bearings formed in the lid of the container above the substrate. The rotation of the stainless steel member within the bearing generated particles which fell directly upon the substrate. Further, because the contact member contacted the upper surface of the substrate, the contact member itself transferred particles directly to the substrate. Also, because the means for fixing the substrate in the container did not fully prevent relative motion between the substrate and the housing, particles were generated when the substrate rubbed against the container housing. These particles could settle on the substrate.

Improvements were made to the prior devices in an attempt to prevent relative motion between the substrate and the container. Such improvements included placing a silicone material on a ledge formed in the housing upon which the substrate rested. However, the silicone material did not entirely prevent relative motion between the substrate and the housing.

Another concern in constructing a container for a substrate is static electrical charge. Substrates are susceptible to electrical discharge. Even small quantities of electrical charge may create high voltages across portions of the substrate possibly destroying or damaging portions of the substrate and rendering the complete substrate useless. Therefore, it is desirable to house the substrate in a container that prevents electrical charge from propagating to the substrate.

SUMMARY OF THE INVENTION

It is therefore a general object of the invention to overcome the above-described limitations and others associated with the prior substrate carriers. More particularly it is an object of the present invention to provide a container for securely carrying a substrate and preventing relative motion between the enclosed substrate and the container. Further objects are to minimize the generation of particles within the container and to protect the substrate from the discharge of static electricity.

In order to accomplish these objects, the apparatus of the present invention includes unique fixing means within a substrate housing. The fixing means applies suction to a first planar surface of the substrate to substantially fix the substrate in a contained position within the housing. The housing contains the substrate and has an opening through which the substrate may be inserted and removed. Closure means covers the housing opening to substantially seal the substrate within the housing.

Preferably, the fixing means comprises at least one suction cup positioned within the housing so as to engage and apply suction to the first planar surface of the substrate when the substrate is received in the contained position in the housing. The suction cups are constructed of a clean plastic material such as conductive silicone that provides a good seal between the suction cup and the substrate surface without creating particles that may settle upon the substrate. In a preferred embodiment, the suction cups only contact a lower surface of the substrate. This arrangement is preferable because the substrates are typically etched, or include components, on the upper surface of the substrate. Further, because the housing is typically stored in a horizontal position, and because suction cups only contact the lower surface of the substrate, any particle generation is likely to occur below the upper surface of the substrate and the generated particles do not settle upon the etched surface of the substrate.

The invention may further include auxiliary suction means for providing additional suction to the fixing means in order to more securely fix the substrate in the contained position. In conjunction with the auxiliary suction means, the present invention also provides auxiliary suction activation means for activating the auxiliary suction means when the housing is moved or that controls the auxiliary suction means to provide a minimum suction level to the fixing means.

Another feature of the present invention substantially prevents the inadvertent discharge of electricity to the substrate while contained in the housing. The housing and closure means are preferably constructed of a conductive or anti-static material. This type of material prevents the buildup of static charge on the surface of the container and also works to dissipate any charge which the substrate may have when it is placed in the box. The present invention also includes a method for securely carrying a substrate. The method includes steps for positioning the substrate in the housing, substantially sealing the substrate in the housing, and applying suction to a first planar surface of the substrate to substantially fix the substrate in a contain position within the housing.

The apparatus and method of the present invention provide several important advantages over prior substrate carriers. Unlike the device shown in the Abe et al. patent, the apparatus of the present invention does not require moving mechanical parts to fix the substrate in the housing. Rather, the present invention uses suction to substantially fix the substrate in the housing. This suction fixing arrangement substantially prevents relative motion between the substrate and the housing thereby substantially reducing the generation of particles that may settle upon the substrate.

Additionally, the apparatus of the present invention need only contact a single side of the substrate to substantially fix the substrate in the housing. Prior devices such as the device disclosed in the Abe et al. patent required contact on both of the planar surfaces of the substrate to stabilize the substrate. Such a requirement reduced the effective area of the substrate that could be used and potentially directly transferred particles to both sides of the substrate. The apparatus of the present invention need only contact a first side of the substrate leaving the opposite side entirely undisturbed.

Another advantage of the present invention is that the housing and the closure means are preferably constructed of a conductive material. The electrically conductive housing and closure means will neither generate nor sustain a surface charge that could be transmitted to the substrate. Further, the housing will readily discharge the substrate should it enter the housing charged.

These and other objects, advantages, and features of the invention will be apparent from the following description of the preferred embodiments, considered along with the accompanying drawings.

BRIEF DESCRIPTION OF THE DRAWINGS

FIG. 1 is perspective view of a substrate carrier or container embodying the principles of the present invention.

FIG. 2 is a partial view in section of the container shown in FIG. 1 but with the lid closed and a substrate contained therein illustrating how the fixing means engages the substrate.

FIG. 6 is a partial view in perspective of a latching mechanism designed to securely hold the lid of the substrate carrier in place.

DESCRIPTION OF THE PREFERRED EMBODIMENTS

Figure 3:
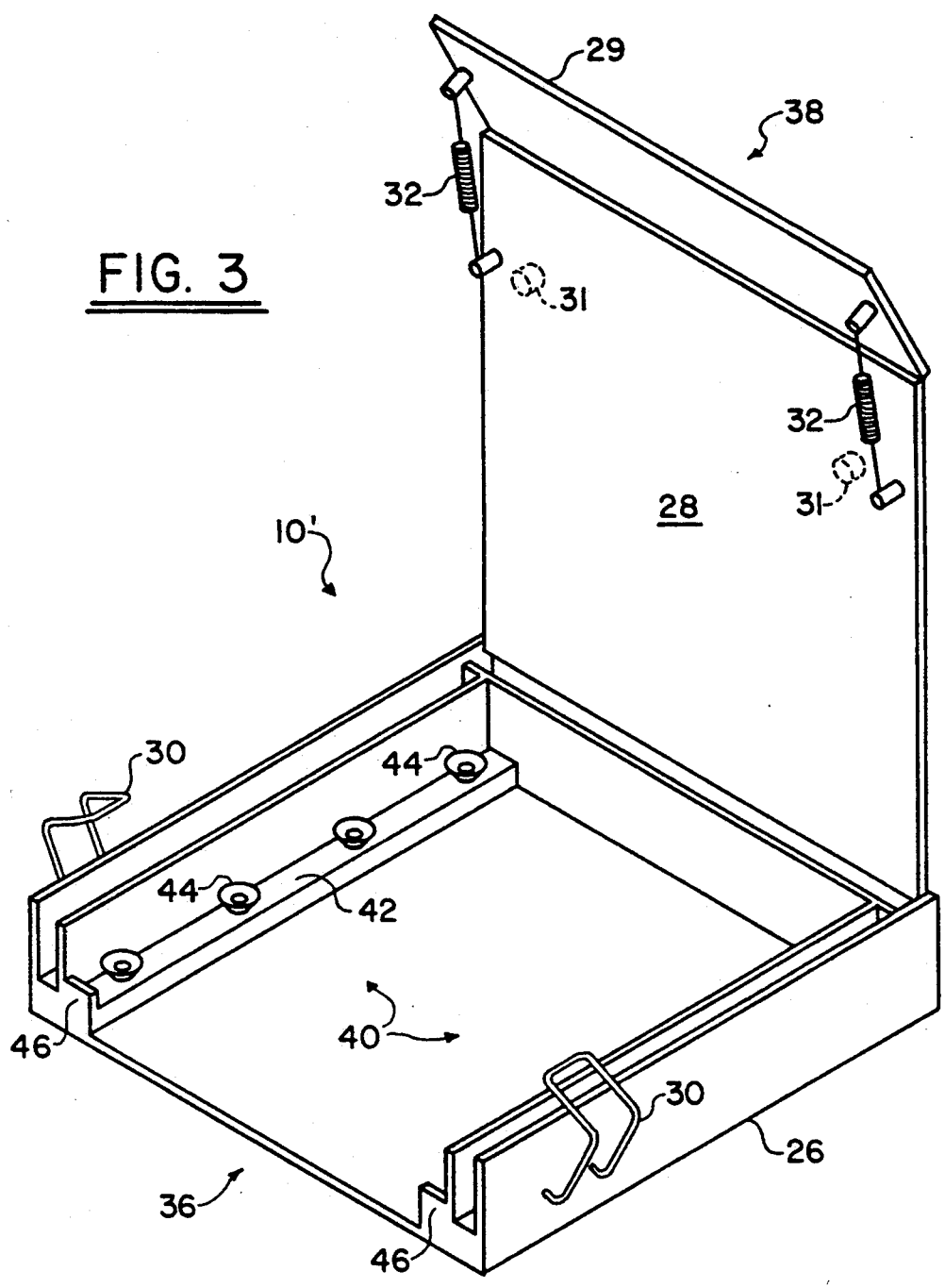
FIG. 3 is a perspective view of an alternate embodiment of a substrate carrier or container embodying the principles of the present invention.

A substrate container embodying the principles of the present invention is shown by way of illustration in FIGS. 1-2. Referring to FIG. 1, the container 10 comprises a housing 12, closure means 14, and fixing means 16.

Referring to FIG. 2, the housing 12 includes an opening 20 through which a substrate 18 may be inserted and removed. The substrate 18 is shown in a contained or received position within the housing 12 in FIG. 2. The closure means 14 is for covering the housing opening 20 to substantially seal the substrate 18 within the housing 12 when the substrate is in the contained position. The housing 12 and closure means 14 preferably are constructed of a conductive material, such as carbon filled polycarbonate or bayon, to prevent static charge from building up on their surfaces and to disperse any static charge that may build up on the substrate 18.

Referring to FIGS. 1 and 2, the fixing means 16 is adapted for applying suction to a first planar surface 22 of the substrate 18 to substantially fix the substrate in the contained position within the housing 12. Preferably, the fixing means 16 comprises a plurality of suction cups 24 constructed of an ultra-clean plastic material. The ultra-clean plastic material does not emit particles either when it is deformed or when it contacts the substrate 18. An example of this type of material is conductive silicone. Thus, the suction cups 24 offer important advantages over the prior mechanical substrate stabilizing devices. As constructed, the suction cups 24 are of an appropriate size and shape to engage and support the substrate 18 within the housing 12 in the desired contained position.

When engaged, the suction cups 24 apply enough suction to the substrate 18 to substantially fix the substrate 18 in the contained position, thus preventing relative motion between the substrate and the housing 12. Typically, when the container 10 is in a horizontal position, the weight of the substrate 18 alone is sufficient to cause the suction cups 24 to apply the desired amount of suction to the substrate.

Referring again to FIG. 1, the housing 12 comprises an open box 26 and a lid 28 which is hinged to the box. Clips 30, pivotally connected to the box 26, are adapted to engage a protrusion 31 formed on the lid 28 when the lid is in a closed position to hold the lid 28 in place so that the lid does not inadvertently open. The lid 28 typically resides in a closed position during use, as shown in FIG. 2. The substrate 18 normally is inserted and removed 12 through the housing opening 20 by a separate substrate handling machine or robot (not shown). The lid 28 opens to provide access to the inside of the container 10 for servicing the container and for allowing an individual to grasp the substrate 18 to remove it from the container by hand.

FIG. 6 shows in detail a unique latching mechanism that holds the lid 28 in place. Clip 30, pivotally mounted on the open box 26 and preferably formed of metal wire, engages a protrusion 31 formed in the lid 28. When engaged, the clip 30 firmly secures the lid 28 in place against the open box 26 thereby preventing the inadvertent opening of the container 10. To release the clip 30, a user may lift the clip 30 past the protrusion 31 thereby causing the clip to disengage the lid 28.

Referring again to FIG. 2, the closure means 14 includes a door 29 which hinges on the lid 28 in a manner known in the art so that it may be opened to provided access to the container 10 through the housing opening 20. Two springs 32 bias the door 29 in a closed position. In the closed position, the door 29 substantially seals the housing opening 20. The springs 32 reside above a portion of the housing 12 that does not contain the substrate 18. Therefore, any particles that may be formed due to the motion of the springs 32 do no settle onto the substrate 18. Additionally, in this preferred embodiment, as well as in a second preferred embodiment discussed hereafter, no moving parts that may generate particles reside above the substrate 18 when the substrate is in the contained position.

Still referring to FIG. 1, on the lower surface of the open box 26 near the housing opening 20 reside two cylindrically shaped pests 34. These posts 34 function to prevent the substrate 18 from accidently falling from the housing 12 should the suction cups 24 lose their grip when the housing 12 is tipped downward. Because the suction cups 24 provide sufficient suction to hold the substrate 18 in place during normal use, the posts 34 are required only for emergency situations.

Figure 4:
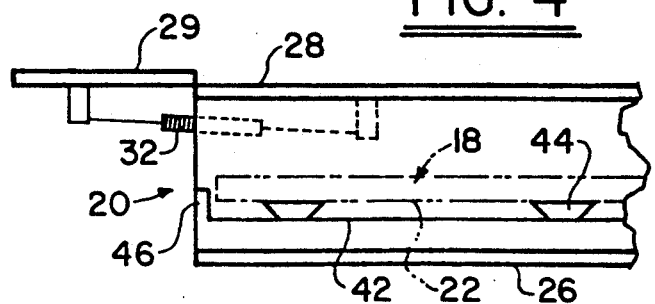
FIG. 4 is a partial view in section of the container shown in FIG. 3 but with the lid closed and a substrate contained therein illustrating how the fixing means engages the substrate.

Referring to FIGS. 3 and 4, a second preferred form of a container 10' embodying the principles of the present invention comprises a housing 36, closure means 38, and fixing means 40. The closure means 38 in the embodiment shown in FIGS. 3 and 4 is identical to the closure means 14 of the first embodiment, as shown in FIGS. 1 and 2, and provides the same advantages.

The housing 36 shown in FIGS. 3 and 4 in this embodiment differs in one significant respect from the housing 12 of the first preferred embodiment. The housing 36 in this embodiment includes two ledges 42 constructed to receive the substrate 18 in the contained position. Upon the ledges 42 are disposed the fixing means 40 preferably comprising a plurality of suction cups 44 disposed such that the substrate 18, when in the contained position, rests on and engages the suction cups. This embodiment of the fixing means 40 provides the same important advantages as the fixing means 16 of the first preferred embodiment.

Further provided on the ledges 42 are raised front portions 46 that provide the same function as the posts 34 did in the first embodiment. If the suction cups 44 were to disengage from the substrate 18 with the container 10' tipped forward, the raised front portions 46 would prevent the substrate from forcing the closure means 38 open and slipping out of the housing opening 20.

Figure 5:
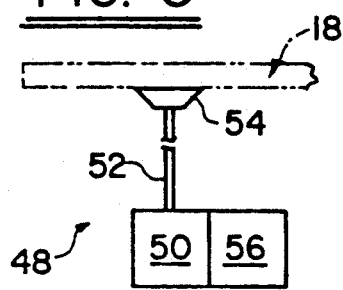
FIG. 5 is a partial diagrammatical view of an auxiliary suction means and an associated auxiliary suction activation means working in conjunction with the fixing means.

Referring to FIG. 5, the apparatus of the present invention also includes auxiliary suction means 48 for applying additional suction from a vacuum source 50 to modified suction cups 54 in order to more securely fix the substrate 18 in the contained position. Preferably, the auxiliary suction means 48 comprises vacuum tubing 52 and associated connections that connect the vacuum source 50 to the modified suction cups 54. The modified suction cups 54 are adapted to receive the additional suction via the vacuum tubing 52 and to apply the additional suction to the first planar surface 22 of the substrate 18.

Because the suction cups 24 as shown in FIGS. 1-4 provide sufficient suction to hold the substrate 18 in place during normal use, the auxiliary suction means 48 is likely only be required when the container 10 and 10' is used as a carrier during the transport of the substrate 18. In that situation, the container 10 and 10' may be subject to rapid positional changes which would urge the substrate 18 to move relative to the housing 12. In such a case, the apparatus of the present invention also includes auxiliary suction activation means 56 for activating the auxiliary suction means 48 when motion of the housing 12 is detected. By supplying additional suction to the modified suction cups 54 when motion of the housing 12 is sensed, relative motion between the substrate 18 and the housing is prevented. Alternatively, the auxiliary suction activation means 56 could be connected to ensure that a minimum vacuum level is provided to the modified suction cups 54 at all times.

The present invention also includes a method for securely carrying a planar substrate. Referring to FIGS. 1 and 2, the method comprises first the step of positioning the substrate 18 within a housing 12 having an opening 20 through which the substrate may be inserted and removed. After positioning the substrate 18 within the housing 12 and covering the housing opening 20 to substantially seal the substrate within the housing, the method concludes with the step of applying suction to a first planar surface 22 of the substrate 18 to substantially fix the substrate in a contained position within the housing 12.

The method of the present invention preferably includes, in the step of applying suction to a first planar surface 22 of the substrate 18, the step of applying suction to the first planar surface 22 of the substrate 18 with at least one suction cup 24 positioned within the housing 12.

The method of the present invention also preferably includes the step of constructing the housing 12 at least partially of an electrically conductive material such as carbon filled polycarbonate or bayon. The construction of the apparatus with such materials works to dissipate charge before it can damage the substrate 18.

The method of the present invention also includes the step of applying additional suction from a vacuum source 50 to the first planar surface 22 of the substrate 18 in order to more securely fix the substrate in the contained position. Referring to FIG. 5, this step preferably includes applying additional suction to the substrate 18 via modified suction cups 54. Preferably, this is accomplished by connecting a hollow tube 52 to the modified suction cups 54 so that an applied suction will more firmly cause the modified suction cups 54 to engage the substrate 18. Preferably, the additional suction is applied to the suction cups when an associated auxiliary suction activation means 56 senses motion of the carrier. Typically, additional suction will be applied when the container 10' serves to house the substrate 18 during transport. Alternatively the additional suction could be supplied such that a minimum level of suction is always applied to the modified suction cups 54.

The above described preferred embodiments are intended to illustrate the principles of the invention, but not to limit the scope of the invention. Various other embodiments and modifications to these preferred embodiments may be made by those skilled in the art without departing from the scope of the following claims.

I claim:

1. An apparatus for containing a planar substrate, the apparatus comprising:
   (a) a housing capable of containing a substrate and having an opening through which the substrate may be inserted and removed in a direction substantially parallel to a plane of the substrate;
   (b) closure means for covering the housing opening to substantially seal a substrate within the housing; and
   (c) fixing means for supporting a substrate by contacting only a first planar surface of the substrate and for applying suction to only the first planar surface of the substrate to substantially fix the substrate in a contained position within the housing when the substrate is set upon the fixing means.

2. The apparatus of claim 1 wherein the fixing means includes:
   (a) at least one suction cup positioned within the housing so as to apply suction to and engage the first planar surface of a substrate when the substrate is received in the contained position.
3. The apparatus of claim 2 wherein the fixing means includes:
   (a) a plurality of suction cups positioned within the housing so as to apply suction to and engage points around a periphery of the first planar surface of a substrate when the substrate is received in the contained position.
4. The apparatus of claim 1 further comprising:
   (a) at least two support members for supporting a substrate in the contained position; and
   (b) a plurality of suction cups disposed on the support members so as to apply suction to and engage points around a periphery of the first planar surface of a substrate when the substrate is received in the contained position.
5. The apparatus of claim 1 wherein the housing is:
   (a) at least partially constructed of an electrically conductive material.
6. The apparatus of claim 1 further comprising:
   (a) auxiliary suction means for applying additional suction from a vacuum source to the fixing means in order to more securely fix a substrate in the contained position.
7. The apparatus of claim 6 further comprising:
   (a) auxiliary suction activation means for activating the auxiliary suction means when motion of the housing is detected.
8. The apparatus of claim 6 further comprising:
   (a) auxiliary suction activation means for activating the auxiliary suction means to provide a minimum level of suction to the fixing means.
9. The apparatus of claim 1 further comprising:
   (a) a latching means for firmly securing a hinged lid to an open box wherein the hinged lid and the open box together form the housing.
10. In a container or carrier for containing a planar substrate, including a housing capable of containing a substrate and having an opening through which a substrate may be inserted and removed in a direction substantially parallel to a plane of the substrate and a closure means for covering the housing opening to substantially seal a substrate within the housing, the improvement comprising:
    (a) fixing means for supporting a substrate by contacting only a first planar surface of the substrate and for applying suction to only the first planar surface of the substrate to substantially fix the substrate in a contained position within the housing when the substrate is set upon the fixing means.
11. A method for securely containing a planar substrate, the method comprising the steps of:
    (a) positioning a substrate within a housing having an opening through which the substrate may be inserted and removed in a direction substantially parallel to a plane of the substrate;
    (b) covering the housing opening to substantially seal the substrate within the housing; and
    (c) applying suction to only a first planar surface of the substrate to substantially fix the substrate within the housing.
12. The method of claim 11 wherein the step of applying suction to a first planar surface of the substrate to substantially fix the substrate in a contained position within the housing includes:
    (a) applying suction to the first planar surface of the substrate with at least one suction cup positioned within the housing.
13. The method of claim 11 wherein the step of applying suction to a first planar surface of the substrate to substantially fix the substrate in a contained position within the housing includes:
    (a) applying suction with a plurality of suction cups to the first planar surface of the substrate at points around a periphery of the first planar surface of the substrate.
14. The method of claim 11 further comprising the step of:
    (a) constructing the housing at least partially of an electrically conductive material.
15. The method of claim 11 further comprising the step of:
    (a) applying additional suction from a vacuum source to the first planar surface of the substrate in order to more securely fix the substrate in the contained position.
16. In a method for securely containing a planar substrate, including the steps of positioning a substrate within a housing having an opening through which the substrate may be inserted and removed in a direction substantially parallel to a plane of the substrate and covering the housing opening to substantially seal the substrate within the housing, the improvement comprising:
    (a) applying suction to only a first planar surface of the substrate to substantially fix the substrate within the housing.

* * * * *